United States Patent [19]
Carano et al.

[11] Patent Number: 5,985,040
[45] Date of Patent: Nov. 16, 1999

[54] PERMANGANATE DESMEAR PROCESS FOR PRINTED WIRING BOARDS

[75] Inventors: Michael V. Carano; Frank Polakovic, both of Plymouth; Beth Ann LaFayette, Minneapolis, all of Minn.

[73] Assignee: Electrochemicals Inc., Maple Plain, Minn.

[21] Appl. No.: 09/157,909

[22] Filed: Sep. 21, 1998

[51] Int. Cl.$^6$ .............. C03C 23/00; C23G 1/02; C11D 9/04
[52] U.S. Cl. .............. 134/2; 134/41; 510/175
[58] Field of Search .................. 29/852; 134/2, 134/40, 41, 42; 216/86; 427/97; 510/174, 175, 176

[56] References Cited

U.S. PATENT DOCUMENTS

| | | | |
|---|---|---|---|
| 4,117,080 | 9/1978 | Kawasaki et al. | 423/235 |
| 4,316,322 | 2/1982 | Tranberg | 29/852 |
| 4,425,380 | 1/1984 | Nuzzi et al. | 427/97 |
| 4,592,852 | 6/1986 | Courduvelis et al. | 252/79.1 |
| 4,601,783 | 7/1986 | Krulik | 156/655 |
| 4,640,719 | 2/1987 | Hayes et al. | 134/40 |
| 4,775,557 | 10/1988 | Bastenbeck et al. | 427/307 |
| 4,820,548 | 4/1989 | Courduvelis | 427/98 |
| 4,853,095 | 8/1989 | D'Ambrisi | 204/82 |
| 4,873,122 | 10/1989 | Darken | 427/97 |
| 4,911,802 | 3/1990 | D'Ambrisi | 204/82 |
| 5,019,229 | 5/1991 | Grapentin et al. | 204/130 |
| 5,032,427 | 7/1991 | Kukanskis et al. | 427/97 |
| 5,132,038 | 7/1992 | Kukanskis et al. | 252/139 |
| 5,271,775 | 12/1993 | Asano et al. | 134/40 |
| 5,311,660 | 5/1994 | Alpaugh et al. | 29/852 |
| 5,334,331 | 8/1994 | Fusiak | 252/542 |
| 5,427,895 | 6/1995 | Magnuson et al. | 430/314 |
| 5,473,118 | 12/1995 | Fukutake et al. | 174/258 |
| 5,554,312 | 9/1996 | Ward | 510/175 |
| 5,558,109 | 9/1996 | Cala et al. | 134/42 |
| 5,612,303 | 3/1997 | Takayanagi et al. | 510/174 |
| 5,688,753 | 11/1997 | Cala et al. | 510/175 |
| 5,690,747 | 11/1997 | Doscher | 134/1 |
| 5,730,890 | 3/1998 | Bickford et al. | 216/86 |
| 5,755,893 | 5/1998 | Cala et al. | 134/2 |
| 5,798,323 | 8/1998 | Honda et al. | 510/176 |
| 5,800,858 | 9/1998 | Bickford et al. | 510/97 |
| 5,814,588 | 9/1998 | Cala et al. | 510/175 |

OTHER PUBLICATIONS

Neusch, "Engineer's Fact File, Primer on High–Performance Laminates," *Electronic Packaging & Production*, p. 39 (Jun., 1997).

Spitz, "Specialty Laminates Fill Special Needs," *Electronic Packaging & Production*, pp. 108–111 (Feb., 1989).

*Primary Examiner*—Randy Gulakowski
*Assistant Examiner*—Yolanda E. Wilkins
*Attorney, Agent, or Firm*—McAndrews, Held & Malloy, Ltd.

[57] ABSTRACT

An improved desmear process for removing resin smeared on an interior wall of a through hole drilled in a resinous substrate, especially resinous substrates made from epoxy, polyimide, cyanate ester resins and bis-maleimide triazine epoxy resins. The process involves contacting the resin smear with a solvent solution to soften the resin smear, followed by treatment with an alkaline permanganate solution to remove the softened resin, and treatment with a neutralizer to neutralize and remove the permanganate residues. The solvent solution comprises a mixture of at least two solvent components, with at least one solvent component being selected from the group consisting of gamma-butyrolactone, ethyl-3-ethoxypropionate, N-ethyl-2-pyrrolidone, N-cyclohexyl-2-pyrrolidone, N-(2-hydroxyethyl)-2-pyrrolidone, and N-octyl-2-pyrrolidone. The solvent solution is selective for the softening and removal of epoxy, polyimide, cyanate ester resins and bis-maleimide triazine epoxy resins.

24 Claims, No Drawings

5,985,040

PERMANGANATE DESMEAR PROCESS FOR PRINTED WIRING BOARDS

TECHNICAL FIELD

The present invention is directed to printed wiring boards having through holes and, in particular, to a desmearing process and a solvent used therein for removing resin smear after drilling the through holes.

BACKGROUND OF THE INVENTION

Printed circuit boards are formed from a layer of conductive material (commonly, copper or copper plated with solder or gold) carried on a substrate of insulating material (commonly glass-fiber-reinforced epoxy resin). A printed circuit board having two conductive surfaces positioned on opposite sides of a single insulating layer is known as a "double-sided circuit board." To accommodate even more circuits on a single board, several copper layers are sandwiched between boards or other layers of insulating material to produce a multilayer circuit board.

To make electrical connections between two or more circuit layers on opposite sides of a double-sided circuit board, a hole is first drilled through the two conducting circuit layers and the insulator board. These holes are known in the art as "through holes," particularly if they extend through the entire circuit board. Through holes are typically from about 0.05 mm to about 5 mm in diameter and from about 0.025 mm to about 6 mm long. The through hole initially has a nonconductive cylindrical bore communicating between the two conductive surfaces. A conductive material or element is positioned in the through hole and electrically connected with the conducting sheets or layers to complete an electrical connection.

Like double-sided circuit boards, multilayer circuit boards also use holes in an intervening insulating layer to complete circuits between the circuit patterns on opposite sides of the insulating layer, as well as intermediate layers. Unless the context indicates otherwise, references in this specification to "through holes" refer to these holes in multilayer boards as well, even if they do not literally go through the entire circuit board.

When a through hole is drilled through a double-sided or multilayer circuit board, the act of drilling leaves a smear of insulating material in the barrel of the hole, as well as on the conductive surface. This smear must be removed prior to positioning or depositing the conductive material or element in the through hole if conductive contact between the through hole and the conducting sheets or layers is to be achieved.

Smear removal processes and solvents are known in the art. Several mechanical and chemical desmear methods that are known in the art are described in U.S. Pat. No. 4,601,783, issued Jul. 22, 1986 to Krulik. One common smear removal process utilizes an alkaline permanganate solution to remove the resin smear. U.S. Pat. No. 4,820,548 to Courduvelis et al. describes an alkaline permanganate desmear process that involves three chemical steps. In the first step, called solvent etch, a solvent is applied to attack and soften the resin structure of the smeared material; in the second step, a permanganate oxidizer is applied to remove the swelled resin; in the third step, a neutralizer is applied to neutralize and remove the permanganate from the resin surface. Suggested solvents for use in the disclosed desmear process include alkaline solutions of propylene glycol ethers. Other known solvents for use in permanganate desmear processes include such chemicals as ethylene glycol monobutyl ether, diethylene glycol monobutyl ether, or tripropylene glycol methyl ether. Permanganate oxidizers used in the desmear process include alkaline solutions of sodium, potassium or lithium permanganate. Neutralizers used in the permanganate desmear process are typically oxalic acid or aqueous acidic solutions such as dilute sulfuric acid or hydrochloric acid. Other known neutralizers are acidified stannous chloride, hydroxylamine hydrochloride or formaldehyde.

The known solvents used in permanganate desmear processes work fairly well in removing resin smear from a laminate material extensively used and known in the industry by the designation FR4, which is a fire retardant epoxy resin fiberglass cloth laminate. In recent years, however, specialized materials, resins and fillers have been used to develop new printed circuit board laminates having improved properties adequate for both state-of-the-art processing and performance requirements. Due to their chemical structure, the specialized resins developed for high performance laminates are very difficult to desmear using permanganate chemical processes. One such specialized resin is an epoxy, polyimide, cyanate ester resin system marketed by Allied Signal under the trademark RCC®. Another high performance resin is BT epoxy, a combination of bis-maleimide triazine (BT) resin and an epoxy resin. Permanganate desmear processes can be used for smear removal of such high performance or specialized resins, but satisfactory smear removal can only be achieved at the highest recommended levels of solvent and permanganate. For many users, such high levels are not practical.

SUMMARY OF THE INVENTION

Accordingly, an object of the present invention is to provide an alternative solvent system that provides increased desmear removal compared to standard permanganate desmear processes.

Another object of the invention is to provide a process that is useful for preparing a resinous substrate for subsequent metallization.

Another object of the invention is to provide an improved hole cleaning process for use on high performance laminates, especially those employing RCC® and BT resins.

Another object of the invention is to provide an improved process for simultaneously cleaning resin smears from the inside walls of through holes and preparing the inside walls for subsequent metallization.

One aspect of the invention involves an alternative solvent for softening resin smear wherein the solvent is surprisingly selective for the softening and removal of resins used in high performance laminates, especially resins such as RCC® and BT resins.

In another aspect, the invention provides a process for removing resin smears from a resinous substrate which comprises the following steps:

a) contacting the resinous substrate with a solvent solution comprising a mixture of at least two solvent components, with at least one solvent component being selected from the group consisting of gamma-butyrolactone, ethyl-3-ethoxy propionate, N-ethyl-2-pyrrolidone, N-cyclohexyl-2-pyrrolidone, N-(2-hydroxyethyl)-2-pyrrolidone and N-octyl-2-pyrrolidone, the component being present in the solvent solution in an amount effective to soften the resin smears;

b) contacting the resinous substrate with an alkaline permanganate treating solution for a time period sufficient to remove the softened resinous smears; and c) contacting the substrate with an aqueous acidic solution to neutralize the permanganate treating solution and remove substantially all manganate residues.

DETAILED DESCRIPTION OF THE INVENTION

While the invention will be described in connection with one or ore preferred embodiments, it will be understood that the invention is not limited to those embodiments. On the contrary, the invention includes all alternatives, modifications, and equivalents as may be included within the spirit and scope of the appended claims.

The process of the invention employs a solvent that is particularly useful for softening resin smears that result from drilling through holes in high performance laminates, especially laminates made with RCC® and BT resins. The solvent comprises a mixture of at least two solvents wherein one of the solvents is selected from a first group consisting of gamma-butyrolactone, ethyl-3-ethoxy-propionate, N-ethyl-2-pyrrolidone, N-(2-hydroxyethyl)-2-pyrrolidone, N-cyclohexyl-2-pyrrolidone, and N-octyl-2-pyrrolidone and mixtures thereof. The selected solvent is present in the mixture in an amount effective to soften the resin smear. In general, an effective amount can be from about 10% to about 40% by volume of the solvent mixture.

The solvent mixture also contains one or more solvents which are selected from a second group consisting of N-methyl-2-pyrrolidone, 2-pyrrolidone, tetrahydrofuran, N-ethyl-2-pyrrolidone, N-cyclohexyl-2-pyrrolidone, and N-dodecyl-2-pyrrolidone. The solvent or combination of solvents selected from the second group are present in the solvent mixture in a total amount ranging from about 60% by volume to about 80% by volume of the solvent mixture. Although there is some overlap between the solvents recited in the first group and the solvents recited in the second group, it should be noted that the solvents are selected so that the solvent of the first group is different from the solvent or solvents from the second group, and there is a mixture of at least two solvents. By combining one or more solvents from the second group with a different solvent selected from the first group of solvents, better resin smear removal can be achieved for laminates made with RCC® and BT resins, than if the solvents in the second group are used alone.

One solvent combination that has been found especially suitable for resin smear removal from high performance laminates is a mixture of N-methyl- 2-pyrrolidone and gamma-butyrolactone. Best results are achieved when the mixture comprises from about 70% to about 90% by volume N-methyl-2-pyrrolidone and from about 30% to about 10% by volume gamma-butyrolactone. An optimum formulation is about 80% by volume N-methyl-2-pyrrolidone and about 20% by volume gamma-butyrolactone.

Examples of other combinations of solvents selected from the first and second groups and contemplated for use herein include the following:

| First Group Solvent | Second Group Solvent(s) |
| --- | --- |
| Gamma-butyrolactone | 2-pyrrolidone |
| Gamma-butyrolactone | N-ethyl-2-pyrrolidone |
| Gamma-butyrolactone | N-cyclohexyl-2-pyrrolidone |
| Gamma-butyrolactone | Tetrahydrofuran |
| Gamma-butyrolactone | Tetrahydroforan + N-methyl-2-pyrrolidone |

-continued

| First Group Solvent | Second Group Solvent(s) |
| --- | --- |
| Gamma-butyrolactone | 2-pyrrolidone + N-ethyl-2-pyrrolidone |
| Gamma-butyrolactone | 2-pyrrolidone + N-cyclohexyl-2-pyrrolidone |
| N-ethyl-2-pyrrolidone | N-methyl-2-pyrrolidone |
| N-(2-hydroxyethyl)-2-pyrrolidone | N-methyl-2-pyrrolidone |
| Ethyl-3-ethoxy-propionate | N-methyl-2-pyrrolidone |
| N-octyl-2-pyrrolidone | N-methyl-2-pyrrolidone |

Other combinations of solvents selected from the first and second groups will be apparent to those skilled in the art.

Another combination of solvents contemplated for use herein is the combination of gamma-butyrolactone and ethyl-3-ethoxy propionate. When used in such a combination, the gamma-butyrolactone can be present in an amount ranging from about 30% by volume to about 90% by volume of the solvent mixture and the ethyl-3-ethoxy propionate can be present in an amount ranging from about 10% by volume to about 50% by volume of the solvent mixture.

A component of some of the present solvent mixtures is water. The amount of water, when present, can be from about 1% to about 25% by volume of the solvent mixture. Deionized water is preferred.

An optional component of the solvent mixtures used in the present invention is a surfactant. One function of the surfactant is to decrease surface tension in the solvent so that the solvent is able to better penetrate the through holes. Better penetration in the through holes results in better and more uniform resin smear removal.

The amount of surfactant that is used in a particular solvent will vary depending upon the surfactant and the particular application. To determine the amount of surfactant that is required for a particular application, one can begin by adding about 0.01% by volume surfactant to the solvent mixture and increasing the amount until the desired performance is achieved. Although additional amounts of surfactant could be added, they might not provide any additional benefit.

The diameters of the through holes are typically within the range of 0.05 mm to 5 mm. With through hole sizes within the range of 4–5 mm, a surfactant may not be necessary. However, with through hole sizes below 4 mm, an increasing amount of surfactant is recommended with decreasing through hole diameters. The circuit boards may vary in thickness (and thus their through holes may vary in length) from that of a double-sided circuit board to a multi-layer circuit board having up to twenty-four layers or more. Thus, when needed, the solvent mixture used in the present invention should contain sufficient surfactant to allow the solvent to penetrate the through holes in circuit boards having through holes of different sizes.

The solvent mixture typically contains from about 0.01% to about 1% by volume, or from about 0.02% to about 0.5% by volume, or from about 0.05 to about 0.1% by volume of the solvent mixture of the surfactant.

Surfactants contemplated to be suitable for use herein include FLUORAD® FC-171, FC-120, FC-430, FC-431, FC-129 and FC-95 anionic fluorochemical surfactants sold by Minnesota Mining and Manufacturing Co., St. Paul, Minn.; and ZONYL® FSN, FSB, FSP, FSJ, FSC, FSA aqueous fluorosurfactants sold by DuPont, Wilmington, Del. Other suitable surfactants are also contemplated.

The solvent mixture of the present invention may be prepared quite easily. The selected solvents, together with water and a surfactant, if required, are added to a beaker or other container having a mixing bar or other mixing capability, and the components are mixed for a period of time sufficient to obtain a generally homogenous mixture. In general, the mixing time will be about 20 seconds to about 2 minutes to achieve thorough mixing. Heat may also be applied to speed up the mixing process. For example, it is desirable to heat the components to a temperature in the range of about 140° to about 180° F., with a temperature of 170° to 175° F. being optimum to effect thorough and efficient mixing.

The solvent mixture is useful in processes which prepare resinous substrates for metallization, and for desmearing resin from the inside walls of holes formed in the resinous substrates, especially high performance resinous substrates such as those made from RCC® and BT resins. The process of the invention may be practiced in a manner well known in the art using the solvent mixture of this invention to soften the resin smear that remains after the drilling of through holes. Further process steps include permanganate removal of the resin smear, followed by neutralization of the permanganate. Each of these process steps is described in further detail below.

The printed wiring board is immersed in the solvent mixture for a time and at a temperature sufficient to soften and swell the resin smear on the drilled through holes. Usually the immersion time will be from about 2 to about 15 minutes, although longer times can also be employed. A 5 minute immersion time gives satisfactory results. The immersion is usually carried out at elevated temperatures, such as from about 140° F. to about 185° F., with a temperature of 175° F. being optimum. Preferably, the solvent mixture is agitated during the solvent swell step to insure a homogenous mixture and also to insure an even temperature distribution throughout the mixture.

Following this solvent swell step, the printed wiring board can be rinsed in deionized water.

Rinsing steps are optionally added between the solvent swell, permanganate oxidation and neutralization steps to remove excess reagents and prolong the life of the subsequent reagent bath. Rinsing may be carried out by flooding, dipping, or spraying, as appropriate, and can be carried out at a temperature the same as one of the temperatures at which the preceding or following step is carried out, at an intermediate temperature (to provide a temperature transition), or at a different temperature, such as room temperature. The rinsing time may vary, but generally 1 to 2 minutes is a sufficient rinsing time.

Following the rinsing step, if one is employed, the printed wiring board is placed in a permanganate oxidizing solution to remove the softened resin. The permanganate solution is generally comprised of water, a water-soluble salt of permanganate, such as sodium, potassium, or lithium permanganate, and sufficient alkali to obtain a solution pH in the alkaline range. A pH of 11 or higher is preferred. Suitable permanganate solutions for use herein include the E-Prep Oxidizer 100 Series and the E-Prep Liquid Oxidizer 200 Series, both sold by Electrochemicals Inc. of Maple Plain, Minn. (USA). The E-Prep oxidizer 100 Series comprises two components, E-Prep Oxidizer 101 component and E-Prep Oxidizer 102 component. A permanganate solution comprising from about 60 to about 90 grams per liter of the E-Prep Oxidizer 101 component and from about 5% to about 8% by volume of the E-Prep Oxidizer 102 component is suitable for use in the present process. An optimum solution comprises about 80 grams per liter of the 101 component and about 5.3% by volume of the 102 component.

The printed wiring board is placed in the permanganate solution for a time and at a temperature sufficient to remove the resin. In general, from 5 to 20 minutes is sufficient to remove the softened resin, with 15 minutes being optimum. The temperature can be from 165° F. to 185° F., with 175° F. being a typical temperature for resin removal.

After treatment with the permanganate solution, it is preferred that the printed wiring board be further treated with a neutralizing agent to neutralize the permanganate solution and remove the permanganate and manganese residues. An optional rinsing step may be added before the neutralization to remove excess permanganate solution.

In general, the neutralizing agent can be any recognized water soluble compound oxidizable by permanganate. Neutralizing agents that are contemplated for suitable use herein include an aqueous acidified stannous chloride solution, i.e. $SnCl_2$—HCl, hydroxylamine hydrochloride, formaldehyde, oxalic acid, and dilute aqueous solutions of hydrochloric or sulfuric acids. A specifically contemplated neutralizing agent is a dilute aqueous solution of sulfuric acid, such as an aqueous solution containing from 6 to 12% by volume sulfuric acid. One suitable neutralizing agent is ELECTRO-BRITE E-Prep Neutralizer Glass Etch, sold by Electrochemicals Inc. of Maple Plain, Minn., which is used in this instance without the Glass Etch component. An optimum neutralizing solution contains about 24% by volume ELECTRO-BRITE E-Prep Neutralizer, and about 8% by volume sulfuric acid.

The printed wire board is placed in the neutralizing solution for a time and at a temperature sufficient to neutralize the permanganate and remove substantially all the permanganate and manganese residues. In general, from 5 to 20 minutes is sufficient to remove the residues, with 5 minutes being optimum. It is preferred that the neutralizing solution be used at elevated temperatures in the range of 110 to 120° F. An optimum working temperature is 115° F.

In the following examples, solvent mixtures in accordance with the present invention are compared with standard solvents used for softening resin smears to determine the usefulness of the solvent mixtures. For these examples, the following procedure is used:

1. RCC®, BT and FR4 copper clad panels are cut to a 2 inch by 2 inch (5 cm by 5 cm) size and are etched in aqueous nitric acid (50/50 v.v.) to remove the copper.
2. The panels are baked until completely dry and then weighed.
3. The panels are then placed in the solvents indicated in the examples, at a temperature of 175° F., for the length of time indicated in the examples.
4. The panels are then removed from the solvents, rinsed with deionized water, and placed in the permanganate oxidizing solution indicated in the examples, at a temperature of 175° F., for the length of time indicated in the examples.
5. The panels are removed from the permanganate oxidizing solution, rinsed with deionized water and placed for 5 minutes in an acid neutralizing solution containing 24% by volume ELECTRO-BRITE E-Prep Neutralizer (without Glass Etch) and 8% by volume sulfuric acid, at a temperature of 115° F.
6. The panels are then removed from the neutralizing solution, baked until dry, and reweighed.
7. The amount of weight loss (or indication of a weight gain) is determined by comparing the weight of each panel at step 2 with its weight at step 6. The changes in weights of the various treated panels are indicated in the examples.

Comparative Examples

Several tests were conducted to determine the ability of a standard solvent, N-methyl-2-pyrrolidone, used for resin smear removal from FR4 printed wire boards, to remove resin smear from high performance laminates made with RCC® and BT resins. The results are indicated low.

TABLE A (Comparative)

| Run | Resin Type | Solvent (N-methyl-2-pyrrolidone) | | (Oxidizer E-Prep 101 at 80 g/liter, E-Prep 102, conc. as indicated) | | Wt. Removed (mg/cm³) |
|---|---|---|---|---|---|---|
| | | Time (min.) | Conc. (% v/v) | Time (min.) | Conc. (% 102 by vol.) | |
| 1 | FR4 | 2 | 50% | 10 | 5.3 | 0.33 |
| 2 | RCC® | 15 | 50% | 20 | 4.0 | 0.19 |
| 3 | RCC® | 10 | 50% | 15 | 5.3 | 0.18 |
| 4 | RCC® | 3 | 50% | 15 | 8.0 | 0.19 |
| 5 | RCC® | 5 | 100% | 15 | 5.3 | wt. gain |
| 6 | FR4 | 5 | 50% | 15 | 5.3 | 0.99 |
| 7 | RCC® | 5 | 50% | 15 | 5.3 | 0.12 |
| 8 | BT | 5 | 50% | 15 | 5.3 | 0.10 |

The results in Table A demonstrate that a single solvent (N-methyl-2-pyrrolidone), although effective for removing resin smear from panels made from FR4 resin, has very limited effectiveness under identical processing conditions, as a desmear solvent for panels made from high performance resins such as RCC® and BT resins. (Compare Run 6 with Runs 7 and 8). Increasing residence time in the solvent solution (Runs 2 and 3), and increasing the concentration of the E-Prep Oxidizer 102 component (Run 4) did not help much to increase the weight loss of the resin smear from the RCC® panels. Moreover, increasing the concentration of the solvent to 100% actually resulted in a weight gain for the RCC® panel (Run 5).

A solvent mixture in accordance with the present invention is used as the desmear solvent instead of the single solvent used in the comparative examples. The concentrations of the solvent components are varied as indicated in the examples. The permanganate oxidizing solution used for each of the runs is a solution of E-Prep 101 at 80 g/liter and E-Prep 102 at 5.3% by volume. The permanganate oxidizing step is carried out at a temperature of 175° F., for a time period of 15 minutes. The neutralizing step used is step 5 as described above. The results are summarized in Table B below.

TABLE B

| Run | Resin Type | Solvent (N-methyl-2-pyrrolidone and gamma-butyrolactone) | | Time (min.) | Wt. removed (mg/cm²) |
|---|---|---|---|---|---|
| | | Butyrolactone Conc. (% v/v) | N-methyl-2-pyrrolidone conc. (% v/v) | | |
| A | FR4 | 10% | 90% | 5 | 0.44 |
| B | RCC® | 10% | 90% | 5 | 0.27 |
| C | BT | 10% | 90% | 5 | 0.24 |
| D | FR4 | 20% | 80% | 5 | 0.13 |
| B | RCC® | 20% | 80% | 5 | 0.32 |
| F | BT | 20% | 80% | 5 | 0.29 |
| G | FR4 | 30% | 70% | 5 | wt. gain |
| H | RCC® | 30% | 70% | 5 | 0.25 |
| I | BT | 30% | 70% | 5 | 0.22 |
| J | FR4 | 40% | 60% | 5 | wt. gain |
| K | RCC® | 40% | 60% | 5 | 0.15 |
| L | BT | 40% | 60% | 5 | 0.14 |

The results in Table B demonstrate that use of a solvent mixture in accordance with the present invention achieves improved smear removal for panels made with RCC® and BT resins compared with the use of a single solvent (Compare Runs B, C, E, F, H, I, K and L with Runs 7 and 8 from Table A). At the optimum concentration of 80% N-methyl-2-pyrrolidone, 20% gamma-butyrolactone, the smear removal for RCC® resin is about 2.5 times greater than the smear removal for RCC® resins when N-methyl-2-pyrrolidone is used alone (Run E, 0.32 mg/cm² vs. Run 7, 0.12 mg/cm²). It is also interesting to note that, while there is a considerable improvement in the amount of smear removal for RCC® resin when a mixture of solvents is used, the use of a solvent mixture is not as effective for removal of FR4 resin (Compare Runs A, D, G and J with Run 6 from Table A). Thus, the enhanced resin smear removal that a mixture of solvents achieves is surprisingly selective for the high performance resins such as RCC® and BT.

The combination of solvents of the present invention also unexpectedly results in a coarser resin surface than other solvents commonly used in permanganate desmear processes. The coarser resin surface advantageously contributes to improved adhesion of subsequently deposited copper to the wall of the through hole. Good adhesion of copper or other metal to the resin surface is one of the most important criteria in printed wire board manufacturing.

What is claimed is:

1. A desmear process for removing resin smear from drilled holes in a printed wiring board having a resinous substrate, comprising the steps of:

a. contacting the resinous substrate with a solvent solution comprising a component selected from a first group consisting of gamma-butyrolactone, ethyl-3-ethoxypropionate, N-ethyl-2-pyrrolidone, N(-2-hydroxyethyl)-2-pyrrolidone, N-cyclohexyl-2-pyrrolidone, N-octyl-2-pyrrolidone, and mixtures thereof, and a component selected from a second group consisting of N-methyl-2-pyrrolidone, 2-pyrrolidone, tetrahydrofuran, N-ethyl-2-pyrrolidone, N-cyclohexyl-2-pyrrolidone, N-dodecyl-2-pyrrolidone, and mixtures thereof, the component from the second group being selected so that it is different from the component of the first group, and the component of the first group being present in the solvent solution in an amount effective to soften the resin smear;

b. contacting the resinous substrate with an alkaline permanganate solution for a time period sufficient to remove the softened resin smear; and c. contacting the resinous substrate with an aqueous acidic solution for a time period sufficient to neutralize the permanganate treating solution and remove substantially all manganate residues.

2. The process of claim 1 wherein the component selected from the first group is present in an amount of from about 10% to about 40% by volume of the solvent.

3. The process of claim 1 wherein the component selected from the second group is present in an amount of from about 60% to about 80% by volume of the solvent.

4. The process of claim 1 wherein the component selected from the first group is gamma-butyrolactone and the component selected from the second group is N-methyl-2-pyrrolidone.

5. The process of claim 4 wherein the solvent comprises:
   a. from about 15% to about 25% by volume of gamma-butyrolactone; and
   b. from about 40% to about 80% by volume of N-methyl-2-pyrrolidone.

6. The process of claim 1 wherein the solvent solution further comprises water in an amount of about 1% to about 25% by volume of the solvent solution.

7. The process of claim 1 wherein the solvent further comprises a surfactant, present in an amount effective to wet a through hole.

8. The process of claim 7 wherein the solvent comprises:
   a. from about 15% to about 25% by volume of gamma-butyrolactone;
   b. from about 40% to about 80% by volume of N-methyl-2-pyrrolidone; and
   c. from about 0.01% to about 0.2% by volume of the surfactant.

9. The process of claim 8 wherein the solvent comprises:
   a. from about 15% to about 25% by volume of gamma-butyrolactone;
   b. from about 40% to about 80% by volume of N-methyl-2-pyrrolidone; and
   c. from about 0.05 to about 0.15% by volume of the surfactant.

10. A desmear process for removing resin smear from drilled holes in a printed wiring board having a resinous substrate, comprising the steps of:
    a. softening the resin smear by contacting the resinous substrate with a solvent at a temperature ranging from about 140° to about 185° F. the solvent comprising a component selected from the group consisting of 2-pyrrolidone, tetrahydrofuran, N-methyl-2-pyrrolidone, N-ethyl-2-pyrrolidone, N-(2-hydroxyethyl)-2-pyrrolidone, N-cyclohexyl-2-pyrrolidone, ethyl-3-ethoxy-propionate and mixtures thereof, and gamma-butyrolactone, the gamma-butyrolactone being present in the solution in an amount effective to soften the resin smear;
    b. contacting the resinous substrate with an alkaline permanganate treating solution for a time period sufficient to remove the softened resin smear; and
    c. contacting the resinous substrate with an aqueous acidic solution for a time period sufficient to neutralize the permanganate treating solution and remove substantially all manganate residues.

11. The process of claim 10 wherein the solvent comprises from about 15% to about 25% by volume of gamma-butyrolactone.

12. The process of claim 10 wherein the solvent further comprises water in an amount of about 1% to about 25% by volume of the solvent.

13. The process of claim 10 wherein the solvent further comprises a surfactant, present in an amount effective to wet a through hole.

14. The process of claim 13 wherein the surfactant is present in an amount of from about 0.01% to about 0.2% by volume.

15. The process of claim 10 wherein the solvent comprises:
    a. from about 15% to about 25% by volume of gamma-butyrolactone; and
    b. from about 40% to about 80% by volume N-methyl-2-pyrrolidone.

16. The process of claim 15 wherein the solvent further comprises a surfactant, present in an amount effective to wet a through hole.

17. The process of claim 10 wherein the solvent comprises from about 30% to about 90% by volume of gamma-butyrolactone, and from about 10% to about 50% by volume of ethyl-3-ethoxy-propionate.

18. The process of claim 17 wherein the solvent further comprises a surfactant, present in an amount effective to wet a through hole.

19. A desmear process for removing resin smear from drilled holes in a printed wiring board having a resinous substrate, comprising the steps of:
    a. contacting the resinous substrate with a solvent comprising from about 40% to about 80% by volume N-methyl-2-pyrrolidone and at least one component selected from the group consisting of gamma-butyrolactone, ethyl-3-ethoxy-propionate, N-ethyl-2-pyrrolidone, N-cyclohexyl-2-pyrrolidone, N-(2-hydroxyethyl)-2-pyrrolidone, N-octyl-2-pyrrolidone and mixtures thereof, with at least one component being present in the solvent solution in an amount effective to soften the resin smear;
    b. contacting the resinous substrate with an alkaline permanganate treating solution for a time period sufficient to remove the softened resin smear; and
    c. contacting the resinous substrate with an aqueous acidic solution for a time period sufficient to neutralize the permanganate treating solution and remove substantially all manganate residues.

20. The process of claim 19 wherein the solvent further comprises water in an amount of about 1% to about 25% by volume of the solvent.

21. The process of claim 19 wherein the solvent further comprises a surfactant, present in an amount effective to wet a through hole.

22. The process of claim 19 wherein the solvent comprises:
    a. from about 15% to about 25% by volume of gamma-butyrolactone; and
    b. from about 40% to about 80% by volume N-methyl-2-pyrrolidone.

23. The process of claim 21 wherein the solvent comprises:
    a. from about 15% to about 25% by volume of gamma-butyrolactone;
    b. from about 40% to about 80% by volume N-methyl-2-pyrrolidone; and
    c. from about 0.01% to about 0.2% by volume of the surfactant.

24. A desmear process for removing resin smear from drilled holes in a printed wiring board having a resinous substrate, the drilled holes having inside walls comprised of the resinous substrate, the desmear process also serving to simultaneously prepare the inside walls to receive a subsequently deposited metal layer, the process comprising the steps of:

(a) softening the resin smear and simultaneously producing a coarse resinous surface on the inside walls of the drilled holes by contacting the resinous substrate with a solvent solution comprising a component selected from a first group consisting of gamma-butyrolactone, ethyl-3-ethoxy-propionate, N-ethyl-2-pyrrolidone, N(-2-hydroxyethyl)-2-pyrrolidone, N-cyclohexyl-2-pyrrolidone, N-octyl-2-pyrrolidone, and mixtures thereof, and a component selected from a second group consisting of N-methyl-2-pyrrolidone, 2-pyrrolidone, tetrahydrofuran, N-ethyl-2-pyrrolidone, N-cyclohexyl-2-pyrrolidone, N-dodecyl-2-pyrrolidone, and mixtures thereof, the component from the second group being selected so that it is different from the component of the first group, and the component of the first group being present in the solvent solution in an amount effective to soften the resin smear;

b. contacting the resinous substrate with an alkaline permanganate solution for a time period sufficient to remove the softened resin smear; and c. contacting the resinous substrate with an aqueous acidic solution for a time period sufficient to neutralize the permanganate treating solution and remove substantially all manganate residues.

* * * * *